United States Patent

Oblak et al.

[11] 4,122,416
[45] Oct. 24, 1978

[54] SHIELDED, D.C. ISOLATED RF CONNECTOR ASSEMBLY

[75] Inventors: John Stewart Oblak, Belle Vernon; Peter Joseph Schmalz, Washington, both of Pa.

[73] Assignee: RCA Corporation, New York, N.Y.

[21] Appl. No.: 710,742

[22] Filed: Aug. 2, 1976

[51] Int. Cl.² ............... H01P 1/04; H01R 17/08; H05K 9/00; H03H 7/04
[52] U.S. Cl. ................... 333/24 C; 333/12; 333/97 R; 339/143 R; 361/424
[58] Field of Search ............... 333/70 R, 73 R, 73 C, 333/12, 24 R, 24 C, 96, 97 R; 325/149, 170, 352, 380, 355–357, 473, 493, 119, 123, 124, 128, 129, 112; 361/331, 380, 424; 339/136 R, 136 C, 139 R, 140 C, 147 R, 143 R, 188

[56] References Cited

U.S. PATENT DOCUMENTS

| 3,913,038 | 10/1975 | Carter et al. ............... 333/70 R |
| 3,973,202 | 8/1976 | Gardner ............... 325/380 |

Primary Examiner—Alfred E. Smith
Assistant Examiner—Marvin Nussbaum
Attorney, Agent, or Firm—Edward J. Norton; Robert L. Troike

[57] ABSTRACT

A shielded, floating ground RF input connector assembly is provided by a conductive enclosure having an aperture in one wall. A coaxial connector is mounted with both the inner and outer conductors extending through the aperture and with the outer conductor spaced from the aperture. A conductive flange extends radially from the outer conductor within the enclosure and covers the opening of the aperture with the flange closely spaced by a member of dielectric material from the inside wall of the enclosure. Bypass capacitors are connected between the conductive flange and the enclosure.

2 Claims, 2 Drawing Figures

SHIELDED, D.C. ISOLATED RF CONNECTOR ASSEMBLY

BACKGROUND OF THE INVENTION

This invention relates to RF connector assemblies and more particularly, to an RF input connector assembly for coupling radio frequency signals from an antenna to the front end of a radio receiver.

In many applications such as radio equipment installed in vehicles, it is desired to energize this equipment from a direct current supply, such as a battery and generator of a vehicle. Although, it is quite common to have the negative terminal of the electrical supply in a vehicle connected to the vehicle frame, this is not universal and in some vehicles the positive terminal is connected to the vehicle frame. Inasmuch as the RF coupling terminal of the antenna must be referenced to the vehicle frame, the equipment cannot be connected in the same manner in vehicles having positive frame reference as in vehicles having negative frame reference. Further, it is desirable that the RF signal energy be contained so that RF energy is not undesirably coupled to other portions of the receiver so as to cause interference. It is, therefore, desirable to provide an RF connection from a coaxial cable to circuitry inside a shielded enclosure while maintaining D.C. isolation between the cable and the enclosure where low RF leakage is required.

BRIEF DESCRIPTION OF THE INVENTION

Briefly, a shielded, floating ground RF input connector assembly includes a conductive enclosure, an aperture in one wall of the enclosure with a coaxial connector mounted through the aperture. A conductive flange extends radially from the outer conductor of the connector with this flange covering the opening of the aperture from within the enclosure and with the flange spaced by a dielectric member between the one wall of the enclosure and the flange.

DESCRIPTION OF THE PREFERRED EMBODIMENT

Figure 1:
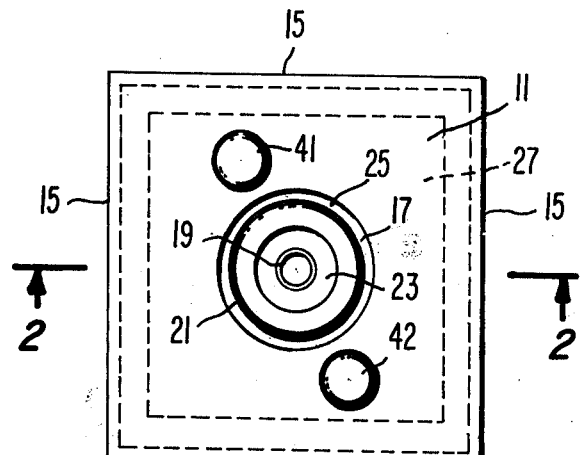
FIG. 1 is a top plan view of an RF connector assembly according to a preferred embodiment of the present invention.
Figure 2:
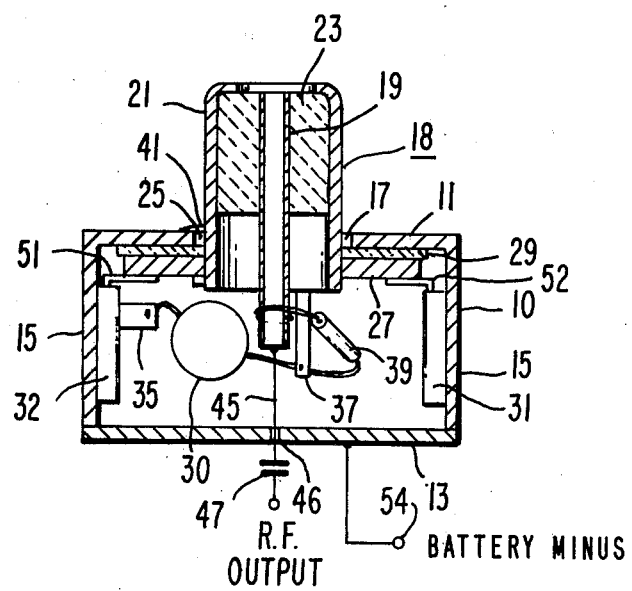
FIG. 2 is a cross-sectional view of the connector assembly taken along lines 2 — 2 of FIG. 1.

Referring to FIGS. 1 and 2, the RF connector assembly includes an enclosure 10 of conductive material having a top wall 11, bottom wall 13 and side walls 15. An aperture 17 is located in approximately the center region of the top wall 11. A coaxial transmission line connector 18 is provided. This connector 18 is adapted to be coupled to a coax antenna lead, for example. The coaxial connector 18 comprises a tubular center conductor 19 insulated and spaced by a dielectric 23 from an outer conductor 21. The coaxial connector 18 passes through the aperture 17 with the outer conductor 21 spaced by an air gap 25 from the top wall 11.

A conductive flange 27 extends radially from and is soldered or otherwise suitably secured to the outer conductor 21 of the coaxial connector 18. This flange 27 extends from the end of the outer conductor 21 located inside the enclosure 10. The flange 27 extends a sufficient distance from the coaxial connector 18 in a direction away from the center conductor 19 so as to cover the opening 25 between the outer conductor 21 and the top wall 11. A spacer of dielectric material 29 is placed between the flange 27 and the inside of the top wall 11 of the enclosure 10. The flange 27 extends a sufficient radial distance and is closely positioned by the spacer from the top wall 11 such that this flange 27 provides a shield which prevents significant leakage of RF energy through the aperture 17 from within the enclosure 10. The inner conductor 19 extends into the enclosure 10 with the conductor 19 passing through the apertures of flange 27 and spacer 29.

Two 250 picofarad mica lumped element low inductance capacitors 31 and 32 are mounted with one terminal electrically connected to one of the side walls 15 and the other terminal electrically connected via flanges 51 and 52, respectively, to flange 27. The two capacitors 31 and 32 together with the capacitance formed between the flange 27 and top wall 11 provide a low impedance path to RF signals at the desired coupling frequency of 450 MHz, for example, while providing D.C. isolation. A first coupling tab 35 is electrically connected to and extends from wall 15 and a second coupling tab 37 is electrically connected to and extends from flange 27. A capacitor 30 is coupled between the flange 27 and a wall 15 via tabs 35 and 37. The capacitor 30 is a 0.01 microfarad capacitor to bypass low frequency RF signals. The RF output signals are coupled from the inner conductor 19 via a lead 45. Lead 45 is passed in insulated manner through an aperture 46 in wall 13. The RF signals can be passed through a suitable coupling capacitor 47 to the next stage of the receiver. In use, the enclosure 11 is electrically connected to the minus terminal 54 of the automobile battery. Resistor 39 is electrically connected between the center conductor 19 and flange 27 via tab 37. This resistor 39 protects the coupling capacitor 47 from static electrical charges which might be coupled across the connector 18 via an antenna.

The enclosure 11 has, for example, the following dimensions. The top plate is about 1 inch by 1 inch with a 0.4 inch diameter aperture in the center. The enclosure has a height of about 0.54 inch. The flange 27 and dielectric member 29 are mounted to the top wall by insulated rivets 41 and 42 passing through the flange 27, dielectric spacer 29 and top wall 11. The aperture in the flange 27 is 0.3 inch diameter which allows the outer conductor 21 of the connector 18 to pass therethrough and be soldered thereto. The flange 27 extends a radial distance of about 0.25 inch beyond the outer conductor 21. The flange 27 therefore extends about 0.2 inches beyond the aperture 17.

What is claimed is:

1. A shielded D.C. isolated RF connector assembly for radio frequency signals comprising:

a conductive enclosure having an aperture in one wall thereof, a coaxial connector having an inner and outer conductor with the inner conductor spaced from the outer conductor by a dielectric member, one end of said coaxial connector extending in a spaced manner through said aperture into said enclosure with the inner conductor of said connector extending beyond said outer conductor within said enclosure, and a conductive flange electrically connected to and extending sufficient radial distance from said outer conductor at said one end of said connector to cover the opening of said aperture from within said enclosure with said flange being spaced from but secured in an insulated manner to the inside of said one wall to provide D.C. isolation while preventing leakage of radio frequency energy external to said assembly.

2. The combination claimed in claim 1 including RF bypass capacitors coupled between said flange and the wall of said enclosure to provide D.C. isolation while providing a low impedance path for the desired radio frequency signals.

* * * * *